US008339020B2

(12) United States Patent
Lee et al.

(10) Patent No.: US 8,339,020 B2
(45) Date of Patent: Dec. 25, 2012

(54) HEAT DISSIPATING DEVICE FOR LIGHTINGS

(75) Inventors: Tsung-Lung Lee, Kaohsiung (TW); Kuo-Sung Huang, Kaohsiung (TW); Cheng-Tao Lee, Kaohsiung (TW)

(73) Assignee: Elements Performance Materials Limited, Kaohsiung (TW)

( * ) Notice: Subject to any disclaimer, the term of this patent is extended or adjusted under 35 U.S.C. 154(b) by 0 days.

(21) Appl. No.: 13/332,428

(22) Filed: Dec. 21, 2011

(65) Prior Publication Data

US 2012/0098403 A1 Apr. 26, 2012

Related U.S. Application Data

(62) Division of application No. 12/833,248, filed on Jul. 9, 2010, now Pat. No. 8,258,681.

(30) Foreign Application Priority Data

Sep. 9, 2009 (TW) ............................... 98130356 A

(51) Int. Cl.
*H01L 33/64* (2010.01)
*F21V 29/02* (2006.01)
*F21V 29/00* (2006.01)

(52) U.S. Cl. .............. 313/45; 313/22; 313/24; 362/294; 362/345

(58) Field of Classification Search .............. 313/41–46; 362/373, 547, 218, 264, 294
See application file for complete search history.

(56) References Cited

U.S. PATENT DOCUMENTS

| | | | | |
|---|---|---|---|---|
| 6,787,999 | B2 * | 9/2004 | Stimac et al. | 362/800 |
| 6,799,864 | B2 * | 10/2004 | Bohler et al. | 362/294 |
| 7,674,015 | B2 * | 3/2010 | Chien | 362/294 |
| 7,866,838 | B2 * | 1/2011 | Wang et al. | 362/249.02 |
| 2008/0149305 | A1 * | 6/2008 | Chen | 165/80.3 |
| 2010/0026158 | A1 * | 2/2010 | Wu | 313/46 |

FOREIGN PATENT DOCUMENTS

TW 358257 U * 6/2009

* cited by examiner

*Primary Examiner* — Mariceli Santiago
(74) *Attorney, Agent, or Firm* — Rosenberg, Klein & Lee

(57) ABSTRACT

A heat dissipating device for lightings includes a light source module, a heat sink, and a converter. The heat sink has a substrate and a plurality of heat dissipating fins extending outward from the substrate. A plurality of channels is formed between the heat dissipating fins. Insides of the channels respectively have a port open to the center of the heat sink. Thereby, the channels of the heat sink can effectively direct the airflow into the center of the heat sink, enhancing the heat dissipating effect of the heat sink.

8 Claims, 8 Drawing Sheets

HEAT DISSIPATING DEVICE FOR LIGHTINGS

RELATED APPLICATIONS

This application is a Divisional patent application of co-pending application Ser. No. 12/833,248, filed on 9 Jul. 2010, now pending. The entire disclosure of the prior application, Ser. No. 12/833,248, from which an oath or declaration is supplied, is considered a part of the disclosure of the accompanying Divisional application and is hereby incorporated by reference.

BACKGROUND OF THE INVENTION

1. Field of the Invention

The present invention relates to a heat dissipating device for lightings; in particular, a heat dissipating device that directs the airflow to increase heat dissipation.

2. Description of Related Art

A light emitting diode (LED) has several advantages such as being eco-friendly, high brightness, energy saving, and long service life. Therefore, it has been widely used in various lighting applications. However, it produces high temperature during light emitting. If the heat cannot be dissipated properly, the illumination performance would be adversely affected and even burn out the lightings.

Referring to FIG. 1 and FIG. 2, which illustrate a conventional heat dissipating devices of type MR16 and E27 respectively. Both devices include a light source module 7, a heat sink 8, and a converter 9. The light source module 7 includes at least one light source 71, a circuit board 72, and a lens 73. The light source 71 is a light emitting diode (LED) and is located on the circuit board 72. The lens 73 is mounted under the light source 71. When the light source 71 is turned on, light is emitted through the lens 73.

The heat sink 8 is connected to the light source module 7. The heat sink 8 has a substrate 81 and a plurality of heat dissipating fins 82 extending outward from the outer edge of the substrate 81. A plurality of channels 83 is formed between the heat dissipating fins 82 for air to flow through to take away heat from the heat sink 8. A connector 84 is connected to the middle or bottom of the substrate 81. The light source 71 and the circuit board 72 of the light source module 7 are located on the connector 84, so that the heat generated from the light source module 7 can be transferred to the heat sink 8.

The converter 9 is connected to the top of the heat sink 8. As shown in FIG. 1, the converter 9 of the MR16 lighting has an insulating socket 91 and two pins 92. The two pins 92 are electrically connected to the light source 71 and the circuit board 72 of the light source module 7, so as to transmit the power to the light source 71 and the circuit board 72.

Referring to FIG. 2, the converter 9 of the E27 lighting has an insulating socket 93 and an electrically conductive terminal 94. The conductive terminal 94 is electrically connected to the light source 71 and the circuit board 72 of the light source module 7, so as to transmit the power to the light source 71 and the circuit board 72.

However, the channels 83 of the conventional heat sink 8 can only direct the airflow between the heat dissipating fins 82 along the outer edge of the heat sink 8. The airflow cannot enter the centre of the heat sink 8. The resulting heat dissipating effect is significantly weakened.

Therefore, there is a need of a novel structure which overcomes the above disadvantages.

SUMMARY OF THE INVENTION

The object of the present invention is to provide a heat dissipating device for lightings, which can effectively direct the airflow into the centre of a heat sink so as to enhance the heat dissipating effect of the heat sink.

In order to achieve the aforementioned objects, according to an aspect of the present invention, a heat dissipating device for lightings includes a light source module, having at least one light source; a heat sink connected to the light source module with a substrate and a plurality of heat dissipating fins extending outward from the substrate, wherein a plurality of channels is formed between the heat dissipating fins, where on the inside of each channel having a port open to the centre of the heat sink; and a converter, connected to the heat sink.

According to another aspect of the invention, the heat dissipating device for lightings includes a light source module having at least one light source; a heat sink, connected to the light source module and having a plurality of heat dissipating fins with a connecting section connected to the bottom of the heat dissipating fins, wherein a plurality of channels is formed between the heat dissipating fins, with the inside of every channel having a port open to the centre of the heat sink; and a converter, connected to the heat sink.

The invention offers the following advantages. The channels of the heat sink can direct the air to flow along the heat dissipating fins at the outer edge of the heat sink. Additionally, the air can also flow toward the center of the heat sink so as to enter the centre of the heat sink and outside the converter, enhancing the heat dissipating effect of the heat sink.

In order to further the understanding regarding the present invention, the following embodiments are provided along with illustrations to facilitate the disclosure of the present invention.

DETAILED DESCRIPTION OF THE PREFERRED EMBODIMENTS

Figure 1:
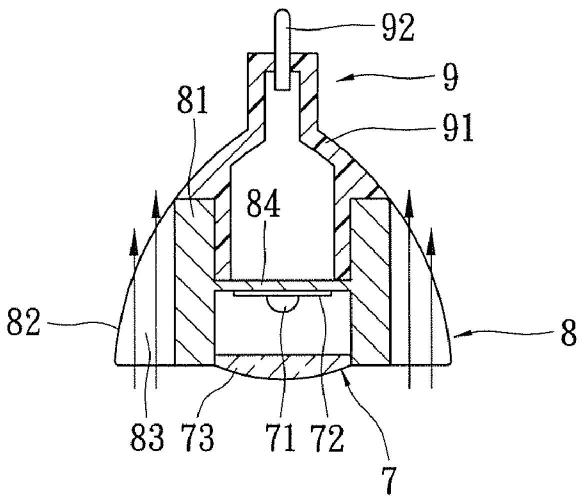
FIG. 1 PRIOR ART
FIG. 1 shows a cross-sectional view of a conventional heat dissipating device for lightings.
Figure 2:
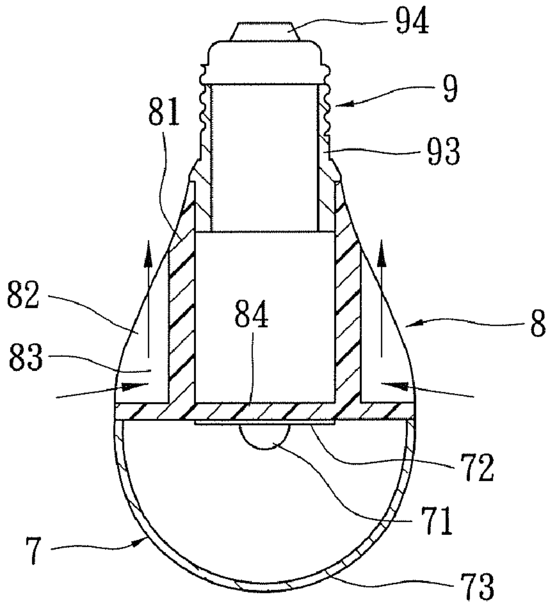
FIG. 2 PRIOR ART
FIG. 2 is a cross-sectional view of another conventional heat dissipating device for lightings.
Figure 3:
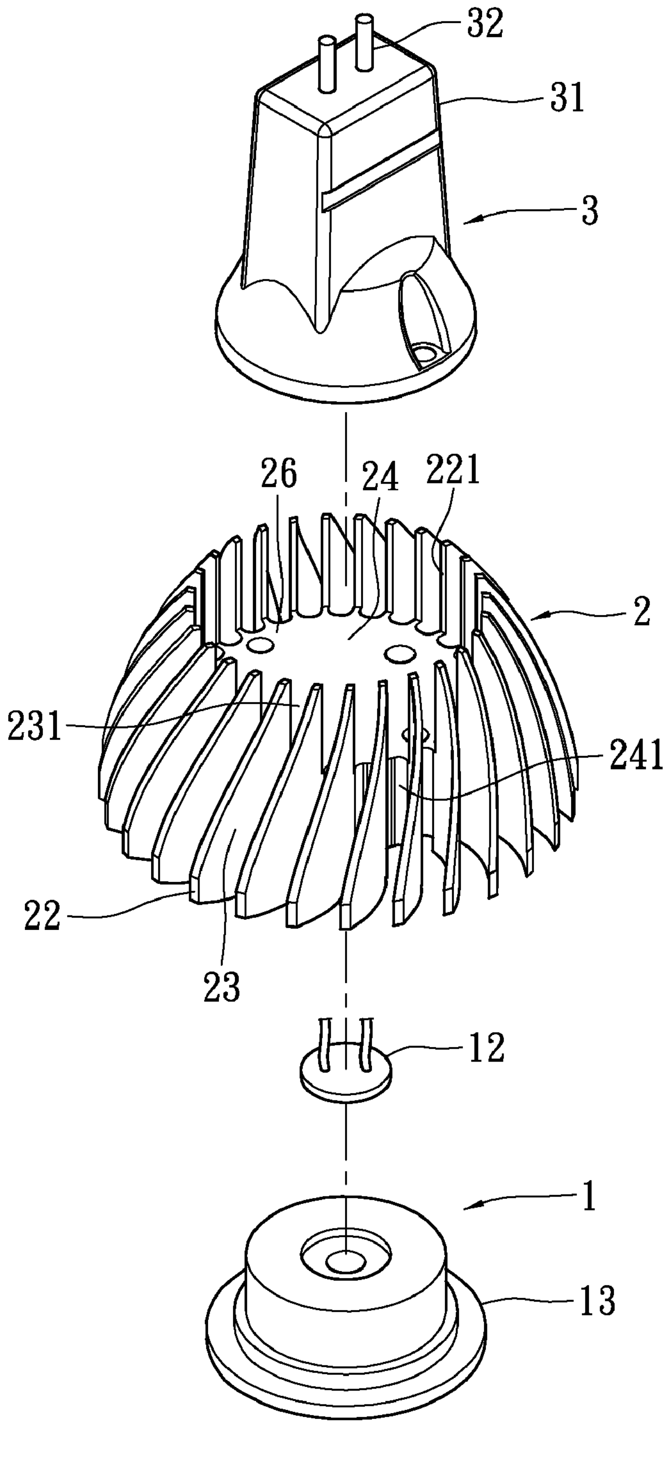
FIG. 3 is a perspective, exploded view of a heat dissipating device for lightings according to a first embodiment of the invention.
Figure 4:
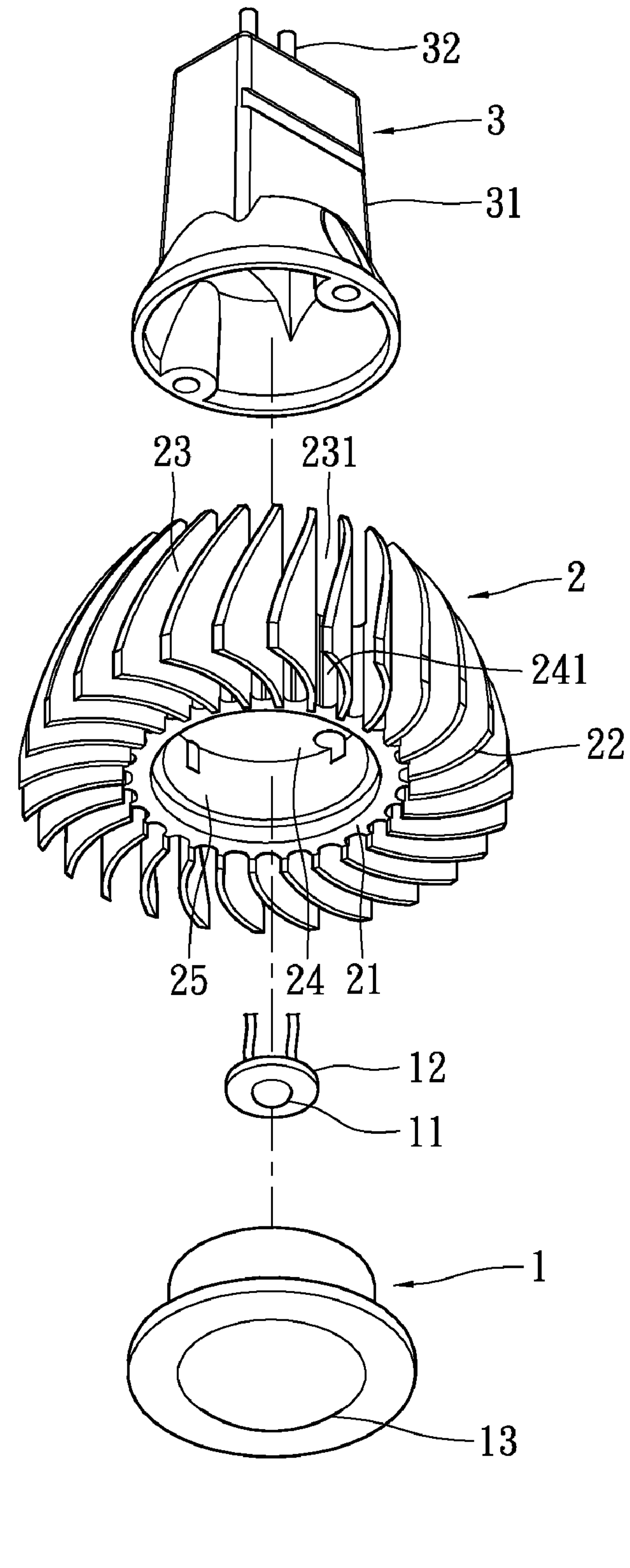
FIG. 4 is a perspective, exploded view of a heat dissipating device for lightings at different angle of view of FIG. 3.
Figure 5:
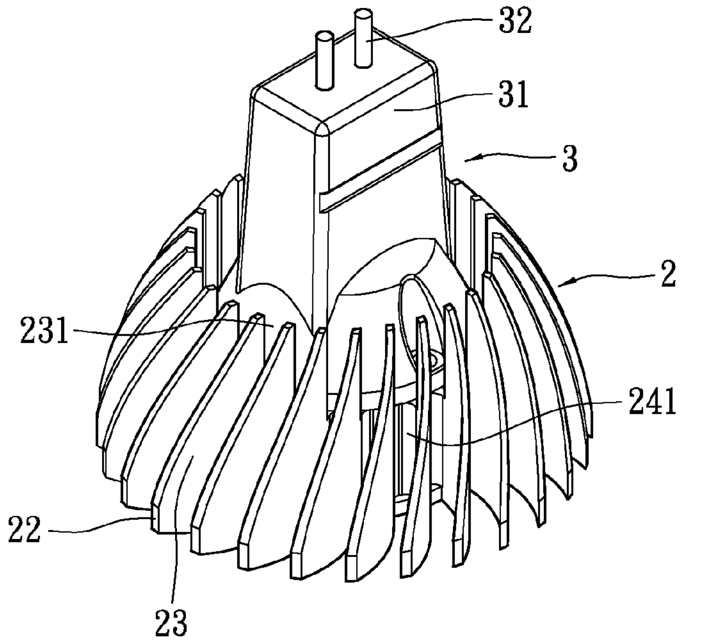
FIG. 5 is a perspective view of a heat dissipating device for lightings according to a first embodiment of the invention.

The aforementioned illustrations and following detailed descriptions are exemplary for the purpose of further explaining the scope of the present invention. Other objectives and advantages related to the present invention will be illustrated in the subsequent descriptions and appended drawings.

Referring to FIG. 3 through FIG. 6, a heat dissipating device for a lighting of type MR16 according to a first embodiment of the invention includes a light source module 1, a heat sink 2, and a converter 3. The light source module 1 has at least one light source 11, a circuit board 12, and a lens 13. The light source 11 is a light emitting diode (LED), and is located on the circuit board 12 in a manner to electrically connect to the circuit board 12. The lens 13 is located below the light source 11. When the light source 11 is on, the light generated from the light source 11 is emitted through the lens 13.

The heat sink 2 is connected to the light source module 1. It is made of highly thermal conductive material. It has a substrate 21 and a plurality of heat dissipating fins 22 extending outward from the substrate 21. The substrate 21 has an outer curved surface 241. The heat dissipating fins 22 can be flat or curved. These heat dissipating fins 22 are spaced in intervals around the outer surface of the substrate 21. A plurality of channels 23 is formed between the heat dissipating fins 22 for air to flow through and take away the heat from the heat sink 2.

Bottoms, tops, and outer sides of these channels 23 can be arranged in a flared position and opened shape to further allow the airflow. At least one of the heat dissipating fins 22 has an inner edge 221 disconnected from the substrate 21. Between the channels 23 have a plurality of port 231, which is arranged in a flared position above the substrate 21. The converter 3 has one end connected to the heat sink 2. A gap is formed between the inner edges 221 of the heat dissipating fins 22 and the converter 3, or between the inner edges 221 of the heat dissipating fins 22 and the outer curved surface 241 of the substrate 21. The gap defines a ring-shaped air passage W, and the air passage W is communicated with the ports 231 of the channels 23 between the heat dissipating fins 22.

The top of the substrate 21 is connected to a connecting section 24 on which the light source 11 and the circuit board 12 of the light source module 1 are attached. The heat generated by the light source module 1 can be passed to the heat sink 2 via the connecting section 24. The substrate 21 of the heat sink 2 has a first space 25 therein. The first space 25 is located under the connecting section 24 to accommodate the light source module 1. A second space 26 is formed above the connecting section 24 of the heat sink 2 to accommodate the converter 3.

The converter 3 is connected to the top of the heat sink 2. In this embodiment, the converter 3 is of type MR 16 and has an insulating socket 31 and two pins 32. The two pins 32 are fixed to one end (top) of the insulating socket 31. The two pins 32 are further electrically connected to the circuit board 12 of the light source module 1 so as to transmit the power to the circuit board 12 and the light source 11. The lower part of the converter 3 is accommodated in the second space 26 of the heat sink 2. The converter 3 is properly secured onto the connecting section 24. Thereby, a heat dissipating device for lightings according to the invention is accomplished.

Figure 6:
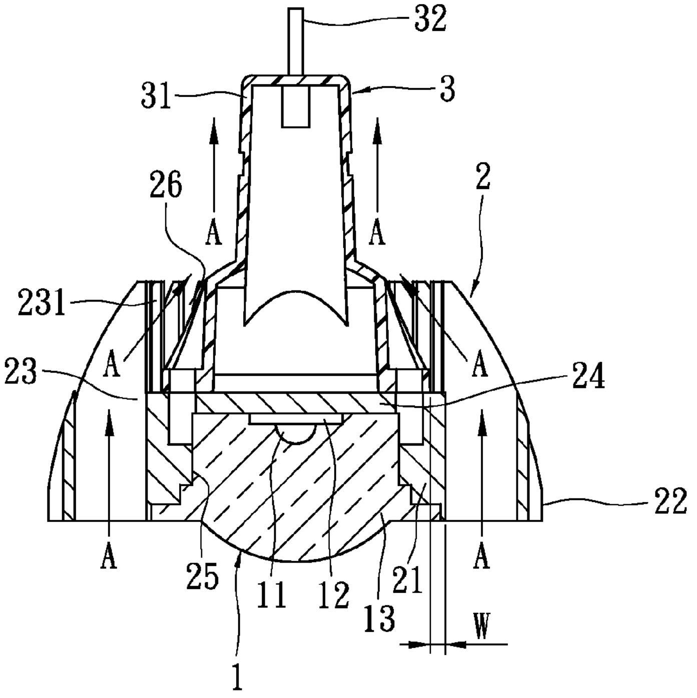
FIG. 6 is a cross-sectional view of a heat dissipating device for lightings according to a first embodiment of the invention.

Referring to FIG. 6, the channels 23 of the heat sink 2 can direct the airflow A to move along the heat dissipating fins 22 at the outer edge of the heat sink 2. Additionally, the airflow A can also flow through the ports 231 of the channels 23 toward the air passage W, which is formed between the heat dissipating fins 22 and the converter 3 or between the heat dissipating fins 22 and the substrate 21, so as to allow airflow A entering the centre of the heat sink 2 next to the converter 3 or a periphery of the substrate 21 of the heat sink 2, enhancing the heat dissipating effect of the heat sink 2. Therefore, the light source 11 of the light source module 1 can emit light at proper temperature, without adversely affecting the illumination performance.

Figure 7:
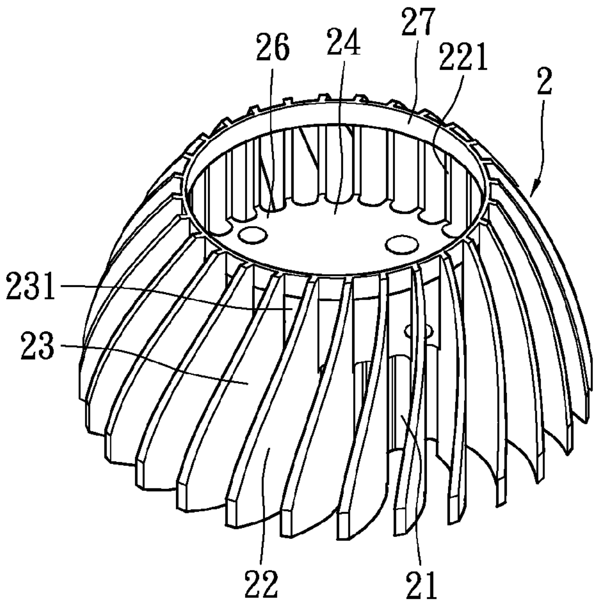
FIG. 7 is a perspective view of a heat dissipating device for lightings having a top ring according to a first embodiment of the invention.
Figure 8:
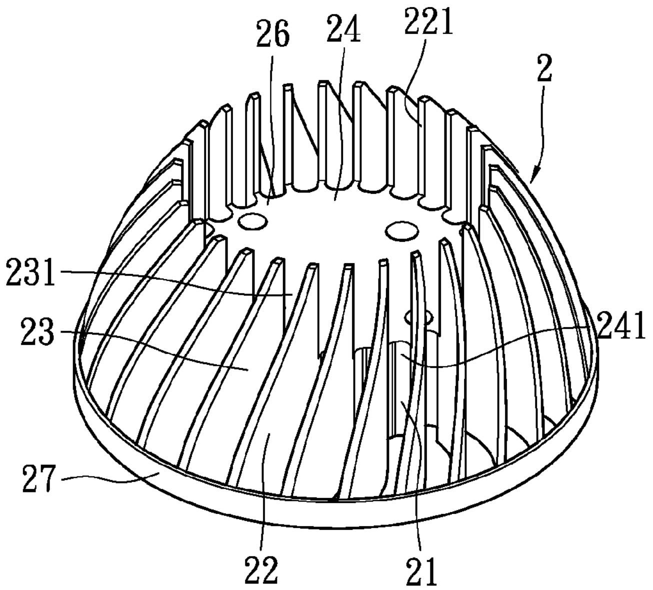
FIG. 8 is a perspective view of a heat dissipating device for lightings having a bottom ring according to a first embodiment of the invention.
Figure 9:
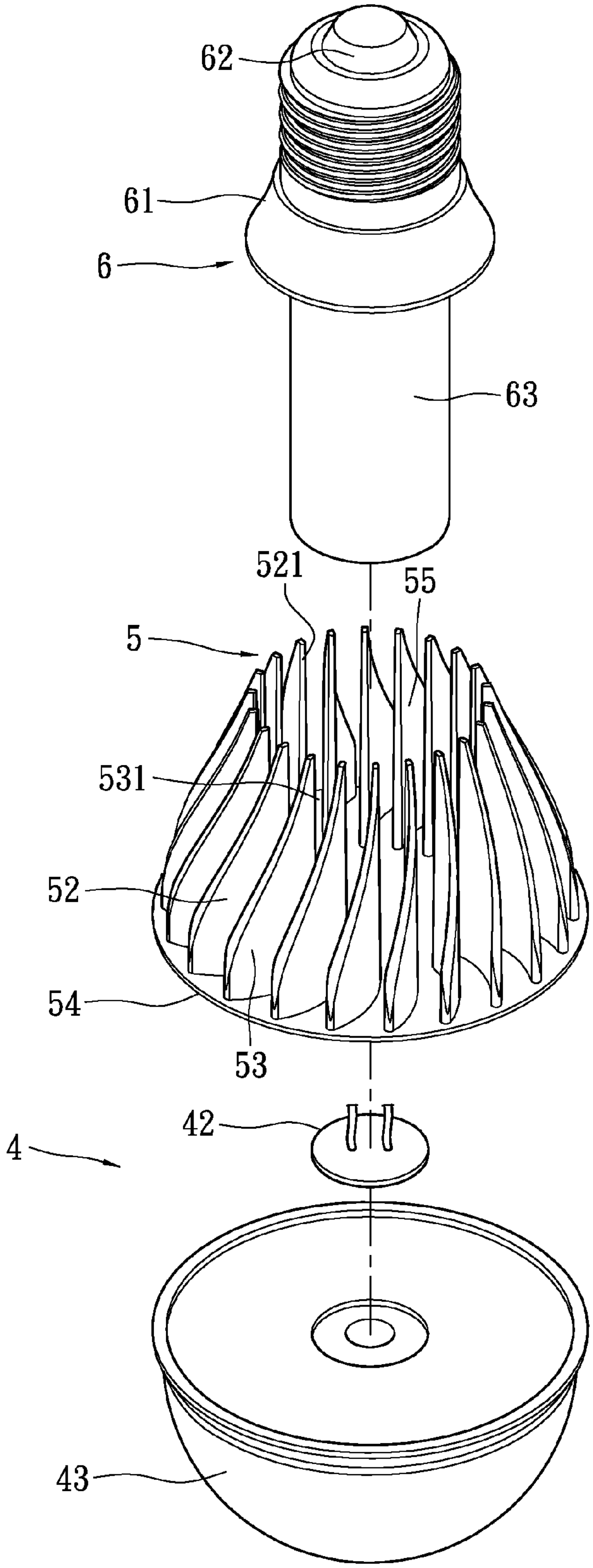
FIG. 9 is a perspective, exploded view of a heat dissipating device for lightings according to a second embodiment of the invention.
Figure 10:
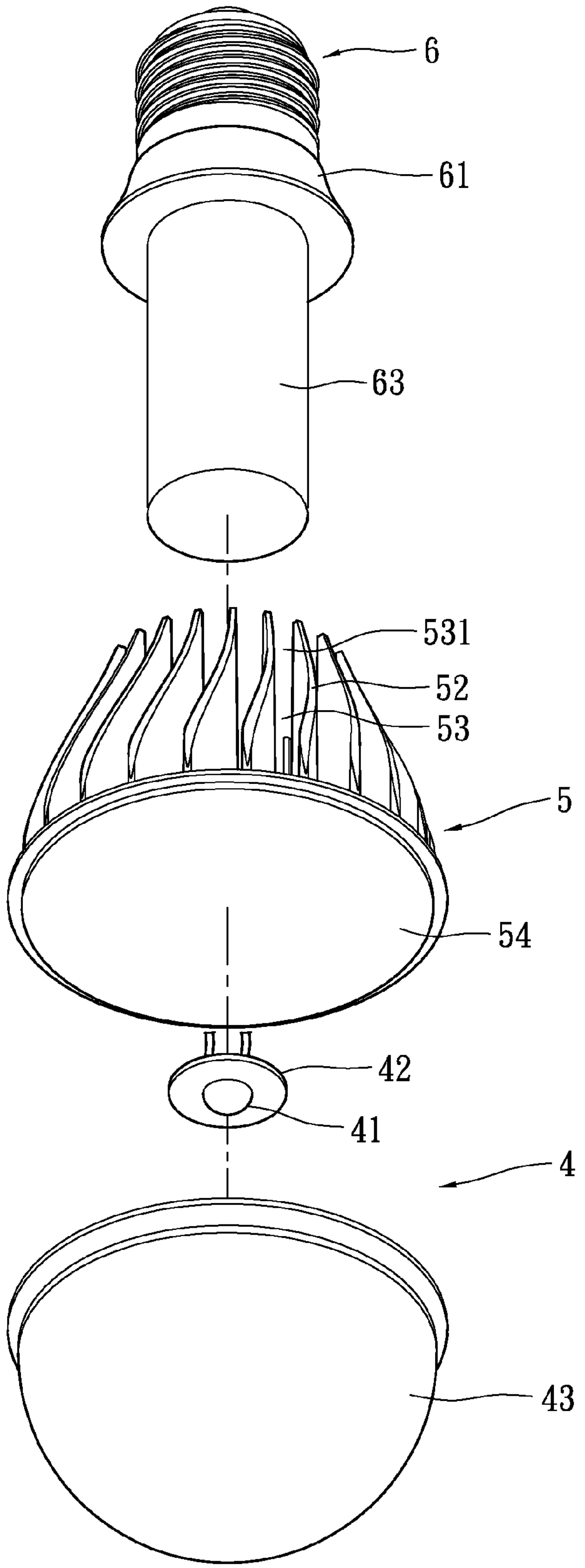
FIG. 10 is a perspective, exploded view of a heat dissipating device for lightings from a different angle of view of FIG. 9.
Figure 11:
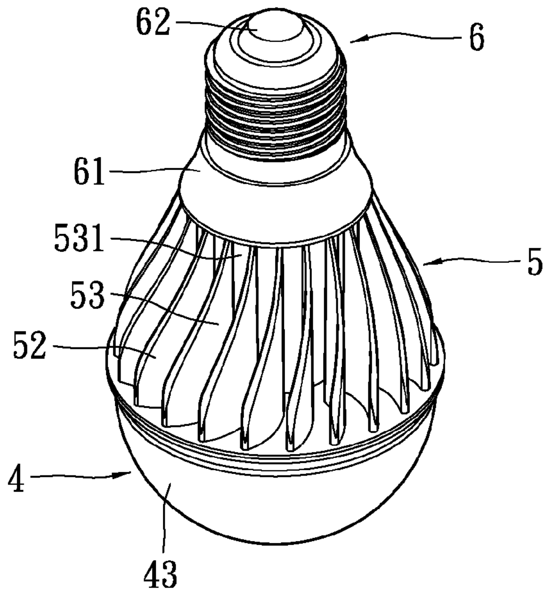
FIG. 11 is a perspective view of a heat dissipating device for lightings according to a second embodiment of the invention.

Referring to FIG. 7 and FIG. 8, in this embodiment, a ring 27 can be further added to the top (in FIG. 7) or the bottom (in FIG. 8) of the heat sink 2. Alternatively, both the top and the bottom of the heat sink 2 can be added with the ring 27, which are not shown. The ring 27 connects to the top or the bottom end of the heat dissipating fins 22 to increase the area for heat dissipation.

Referring to FIG. 9 through FIG. 12, a heat dissipating device for lightings of type E27 according to a second embodiment of the invention includes a light source module 4, a heat sink 5, and a converter 6. The light source module 4 has at least one light source 41, a circuit board 42, and a lens 43. The light source 41 is a light emitting diode (LED), and is located on the circuit board 42 in a manner to electrically connect to the circuit board 42. The lens 43 is located below the light source 41.

The heat sink 5 is connected to the light source module 4. The heat sink 5 has a plurality of heat dissipating fins 52 and a connecting section 54 connecting to the bottom of the heat dissipating fins 52. The bottom edges of the heat dissipating fins 52 are fixed to a top surface of the connecting section 54. The heat dissipating fins 52 can be flat or curved. These heat dissipating fins 52 are spaced in intervals on top of the connecting section 54. A plurality of channels 53 is formed between the heat dissipating fins 52 for the air to flow through and take away the heat from the heat sink 5.

The tops and outer edges of these channels 53 can be arranged in a flared positions to promote airflow. At least one of the heat dissipating fins 52 has an inner edge 521 disconnected from a lower part 63 of the converter 6. In this embodiment, all inner edges 521 of the heat dissipating fins 52 are disconnected from the lower part 63 of the converter 6, so as to form a gap between the inner edges 521 and an outer surface of the lower part 63 of the converter 6. The gap defines a ring-shaped air passage W encircled around an outer surface of the lower part 63 of the converter 6. Each of the channels 53 has a port 531 arranged in flared position and opened shape to communicated with the channels 53 internally with the centre of the heat sink 5. The air passage W is communicated with the ports 531 of the channels 53 between the heat dissipating fins 52.

The light source 41, the circuit board 42, and the lens 43 of the light source module 4 are attached to the connecting section 54 so that the heat generated by the light source module 4 can be passed onto the heat sink 5 via the connecting section 54. The heat sink 5 has a space 55 above the connecting section 54 for accommodating the converter 6.

The converter 6 can be connected to the top of the heat sink 5 or onto the connecting section 54. In this embodiment, the converter 6 is of type E27, and has an insulating socket 61 and an electrically conductive terminal 62. The electrically conductive terminal 62 is electrically connected to the light source 41 and the circuit board 42 of the light source module 4 so as to transmit the power to the circuit board 42 and the light source 41. The lower part of the converter 6 is accommodated in the space 55 of the heat sink 5. The converter 6 is properly secured onto the heat sink 5.

Figure 12:
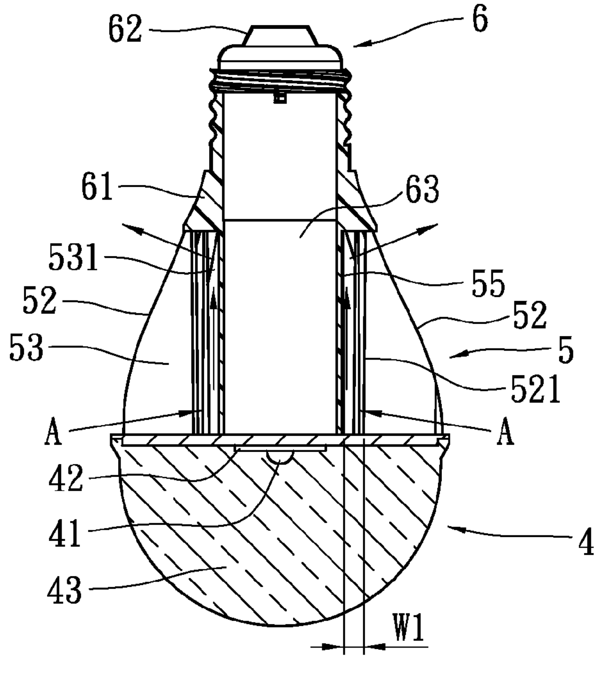
FIG. 12 is a cross-sectional view of a heat dissipating device for lightings according to a second embodiment of the invention.

Referring to FIG. 12, the channels 53 of the heat sink 5 can direct the airflow A to move along the heat dissipating fins 52 at the outer edge of the heat sink 5. Additionally, the airflow A can also flow through the ports 531 of the channels 53 toward the air passage W, which is formed between the heat dissipating fins 52 and the converter 6 so as to the airflow A enter the centre of the heat sink 5 next to the converter 6 for dissipating heat produced by the converter 6, enhancing the heat dissipating effect of the heat sink 5. Therefore, the light source 41 of the light source module 4 can emit light at proper temperature, without adversely affecting the illumination performance.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A heat dissipating device for lightings, comprising:

a light source module, having at least one light source;

a heat sink, having a plurality of heat dissipating fins and a connecting section, wherein the connecting section has a top surface connected to bottom edges of the heat dissipating fins and a bottom surface connected to the light source module, wherein a plurality of channels is formed between the heat dissipating fins, wherein the channels respectively having a port formed at an inner side thereof; and a converter, having one end extended among the heat dissipating fins and connected to the connecting section of the heat sink; wherein at least one of the heat dissipating fins has an inner edge adjacent to and disconnected from the converter;

wherein a gap is formed between the inner edge of the heat dissipating fins and an outer surface of the converter to define a ring-shaped air passage, the air passage communicates with the ports of the channels between the heat dissipating fins.

2. The heat dissipating device of claim 1, wherein the light source is a light emitting diode.

3. The heat dissipating device of claim 1, wherein the light source module has a circuit board and a lens; the light source is located on the circuit board; and the lens is located below the light source.

4. The heat dissipating device of claim 1, wherein the heat dissipating fins are flat or curved; the heat dissipating fins are spaced in intervals onto the top of the connecting section; and tops and the outer edges of the channels are arranged in opened shape.

5. The heat dissipating device of claim 1, wherein a space is defined above the connecting section of the heat sink and among the heat dissipating fins to accommodate a lower part of the converter.

6. The heat dissipating device of claim 1, wherein the converter is of type E27 and has an insulating socket and an electrically conductive terminal; and the electrically conductive terminal is electrically connected to the light source module.

7. The heat dissipating device of claim 6, wherein the heat sink further includes a substrate formed with an outer curved surface, the connecting section is connected to a bottom of the heat dissipating fins, wherein a gap is formed between the inner edge of the heat dissipating fins and the outer curved surface of the substrate to define a ring-shaped air channel, the air channel communicates with the port open of the inner edge of the heat dissipating fins.

8. The heat dissipating device of claim 5, wherein all inner edges of the heat dissipating fins are disconnected from a lower part of the converter, wherein the gap is formed between the inner edges and an outer surface of the lower part of the converter.

* * * * *